(12) United States Patent
Maruyama et al.

(10) Patent No.: US 8,717,037 B2
(45) Date of Patent: May 6, 2014

(54) ELECTRONIC CONTROL DEVICE

(75) Inventors: Masayuki Maruyama, Chiyoda-ku (JP);
Hiroyuki Kozuki, Chiyoda-ku (JP);
Katsuya Ikemoto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 201 days.

(21) Appl. No.: 13/083,285

(22) Filed: Apr. 8, 2011

(65) Prior Publication Data

US 2012/0101655 A1    Apr. 26, 2012

(30) Foreign Application Priority Data

Oct. 26, 2010 (JP) ................................. 2010-239821

(51) Int. Cl.
*G01R 31/02* (2006.01)

(52) U.S. Cl.
USPC ........... 324/537; 341/158; 341/159; 341/161; 341/120; 701/1; 701/29.1; 701/33.7; 340/870.21

(58) Field of Classification Search
None
See application file for complete search history.

(56) References Cited

U.S. PATENT DOCUMENTS

| | | | | |
|---|---|---|---|---|
| 4,254,469 A | * | 3/1981 | Whitely | 702/87 |
| 4,451,821 A | * | 5/1984 | Domogalla | 341/158 |
| 5,182,459 A | * | 1/1993 | Okano et al. | 307/10.1 |
| 5,207,091 A | * | 5/1993 | Shibata et al. | 73/114.61 |
| 5,262,780 A | * | 11/1993 | Gray | 341/166 |
| 5,389,926 A | * | 2/1995 | Fukushima | 341/120 |
| 5,432,514 A | * | 7/1995 | Mukuda et al. | 341/120 |
| 5,686,918 A | * | 11/1997 | Uda | 341/161 |
| 5,848,366 A | * | 12/1998 | Ueda | 701/36 |
| 6,535,435 B2 | * | 3/2003 | Tanaka et al. | 365/189.09 |
| 6,732,044 B2 | * | 5/2004 | Hashimoto et al. | 701/114 |
| 7,009,537 B2 | * | 3/2006 | Kabune | 341/120 |
| 8,346,377 B2 | * | 1/2013 | Zushi et al. | 700/22 |
| 2005/0160334 A1 | * | 7/2005 | Kabune | 714/724 |
| 2012/0101655 A1 | * | 4/2012 | Maruyama et al. | 701/1 |

FOREIGN PATENT DOCUMENTS

| | | |
|---|---|---|
| CN | 1630199 A | 6/2005 |
| JP | 46-38655 | 11/1971 |
| JP | 3-268610 A | 11/1991 |
| JP | 2005-184118 A | 7/2005 |
| JP | 2005-323273 A | 11/2005 |
| JP | 2009-135655 A | 6/2009 |

OTHER PUBLICATIONS

Extended European Search Report dated Jan. 31, 2013 issued in EP Application No. 11161845.0.
Chinese Office Action issued in counterpart Chinese Application No. 201110152105.5 dated Jan. 13, 2014.

* cited by examiner

*Primary Examiner* — Thomas Tarcza
*Assistant Examiner* — Richard Goldman
(74) *Attorney, Agent, or Firm* — Sughrue Mion, PLLC

(57) ABSTRACT

A main microcomputer abnormality determination section checks whether or not a voltage value of Vcc based on digital data output from a main microcomputer analog-to-digital converter is equal to or higher than a threshold value to thereby perform abnormality determination for the main microcomputer analog-to-digital converter and Vref. A sub microcomputer abnormality determination section checks whether or not the voltage value of Vcc is equal to or higher than a threshold value based on digital data output from a sub microcomputer analog-to-digital converter to thereby perform abnormality determination for the sub microcomputer analog-to-digital converter and Vref. An abnormality identifying section identifies an abnormality occurring site by using both results of the abnormality determination performed by the main microcomputer abnormality determination section and the sub microcomputer abnormality determination section.

15 Claims, 2 Drawing Sheets

Prior Art

ELECTRONIC CONTROL DEVICE

BACKGROUND OF THE INVENTION

1. Field of the Invention

The present invention relates to an electronic control device having an abnormality detection function (failure diagnosis function) for an analog-to-digital converter for converting an analog signal into a digital signal.

2. Description of the Related Art

FIG. 2 is a block diagram illustrating a conventional electronic control device. Note that, the electronic control device of FIG. 2 corresponds to a conventional device as disclosed in, for example, Japanese Patent Application Laid-open No. 2009-135655. In FIG. 2, a plurality of control signals 150a are input to a main microcomputer 110 from an external sensor and the like. The control signal 150a is converted into digital data by a main microcomputer analog-to-digital converter 111 built into the main microcomputer 110, and is used to control an operation of a control subject.

Here, if analog-to-digital conversion cannot be normally performed on the plurality of control signals 150a due to a failure of the main microcomputer analog-to-digital converter 111, this may exert a significant influence upon a result of the control using an analog-to-digital conversion result of the control signal 150a.

Therefore, the conventional device detects a failure of the main microcomputer analog-to-digital converter 111 by the following procedure. First, a signal output section 115 built into the main microcomputer 110 operates a predetermined voltage switching circuit 130. In response to this operation, the predetermined voltage switching circuit 130 generates a failure diagnosis signal 130a from a reference voltage for analog-to-digital conversion (hereinafter, referred to as "Vref"). The failure diagnosis signal 130a is input to the main microcomputer 110.

Further, the failure diagnosis signal 130a is converted into main microcomputer analog-to-digital conversion data 111a by the main microcomputer analog-to-digital converter 111. Then, the main microcomputer analog-to-digital conversion data 111a is input to difference calculating means 122 within a sub microcomputer 120 through a communication line 131. In addition, the failure diagnosis signal 130a is also input to the sub microcomputer 120, and is converted into sub microcomputer analog-to-digital conversion data 121a by a sub microcomputer analog-to-digital converter 121. The sub microcomputer analog-to-digital conversion data 121a is input to the difference calculating means 122.

The difference calculating means 122 calculates a difference value between the main microcomputer analog-to-digital conversion data 111a and the sub microcomputer analog-to-digital conversion data 121a, and generates difference value data 122a on the difference value. The difference value data 122a is input to failure diagnosis means (abnormality determination means) 114 within the main microcomputer 110 through a communication line 132. The failure diagnosis means 114 monitors fluctuations in the difference value between the main microcomputer analog-to-digital conversion data 111a and the sub microcomputer analog-to-digital conversion data 121a based on the difference value data 122a. Further, the failure diagnosis means 114 determines that at least one of the main microcomputer analog-to-digital converter 111 and the sub microcomputer analog-to-digital converter 121 is in failure when confirming that the difference value has exceeded a preset upper limit difference value 110a.

Here, the failure diagnosis signal 130a is a binary rectangular wave signal (pulse signal) that is switched periodically. Therefore, the main microcomputer analog-to-digital conversion data 111a and the sub microcomputer analog-to-digital conversion data 121a include results of the analog-to-digital conversion for the respective binary voltages of the failure diagnosis signal 130a. The difference value data 122a also includes the difference value corresponding to the binary voltages of the failure diagnosis signal 130a.

In the conventional device as described above, the predetermined voltage switching circuit 130 generates the failure diagnosis signal 130a from Vref. However, Vref represents a reference voltage for the main microcomputer analog-to-digital converter 111. Therefore, when fluctuations occur in Vref, the main microcomputer analog-to-digital conversion data 111a of the main microcomputer analog-to-digital converter 111 and the sub microcomputer analog-to-digital conversion data 121a of the sub microcomputer analog-to-digital converter 121 mutually exhibit similar fluctuations. As a result, an abnormality in Vref cannot sometimes be detected even if the conversion data is compared between the main microcomputer analog-to-digital converter 111 and the sub microcomputer analog-to-digital converter 121. The conventional device may thus fail to appropriately perform abnormality detection for the analog-to-digital converter due to the abnormality in Vref.

SUMMARY OF THE INVENTION

The present invention has been made in order to solve the above-mentioned problem, and an object thereof is to obtain an electronic control device capable of detecting an abnormality in an analog-to-digital converter and also capable of detecting an abnormality in a reference voltage for analog-to-digital conversion.

An electronic control device according to the present invention includes: an analog-to-digital converter which inputs a reference voltage for analog-to-digital conversion output from a first voltage source; a voltage for abnormality determination output from a second voltage source independent of the first voltage source and has a voltage value lower than the reference voltage; and a control signal being an analog signal, for converting the control signal and the voltage for abnormality determination into digital data by using the reference voltage; a processor for performing a control operation for a predetermined control subject by using the digital data on the control signal that is input from the analog-to-digital converter; and abnormality determination means for monitoring the voltage value of the voltage for abnormality determination based on the digital data input from the analog-to-digital converter to perform abnormality determination for the analog-to-digital converter and the reference voltage, and determining that one of the analog-to-digital converter and the reference voltage is abnormal when the voltage value of the voltage for abnormality determination falls out of a predetermined normal range.

According to the electronic control device of the present invention, when the voltage value of the voltage for abnormality determination that has been output from the second voltage source independent of the first voltage source and subjected to the analog-to-digital conversion falls out of the predetermined normal range, the abnormality determination means determines that any one of the analog-to-digital converter and the reference voltage is abnormal. Therefore, even when fluctuations occur in the reference voltage, the fluctuations in the reference voltage can be detected, and hence it is possible to detect an abnormality in the analog-to-digital converter and also possible to detect the abnormality in the reference voltage.

DETAILED DESCRIPTION OF THE PREFERRED EMBODIMENTS

Hereinafter, an embodiment for carrying out the present invention is described with reference to the drawings.

First Embodiment

Figure 1:
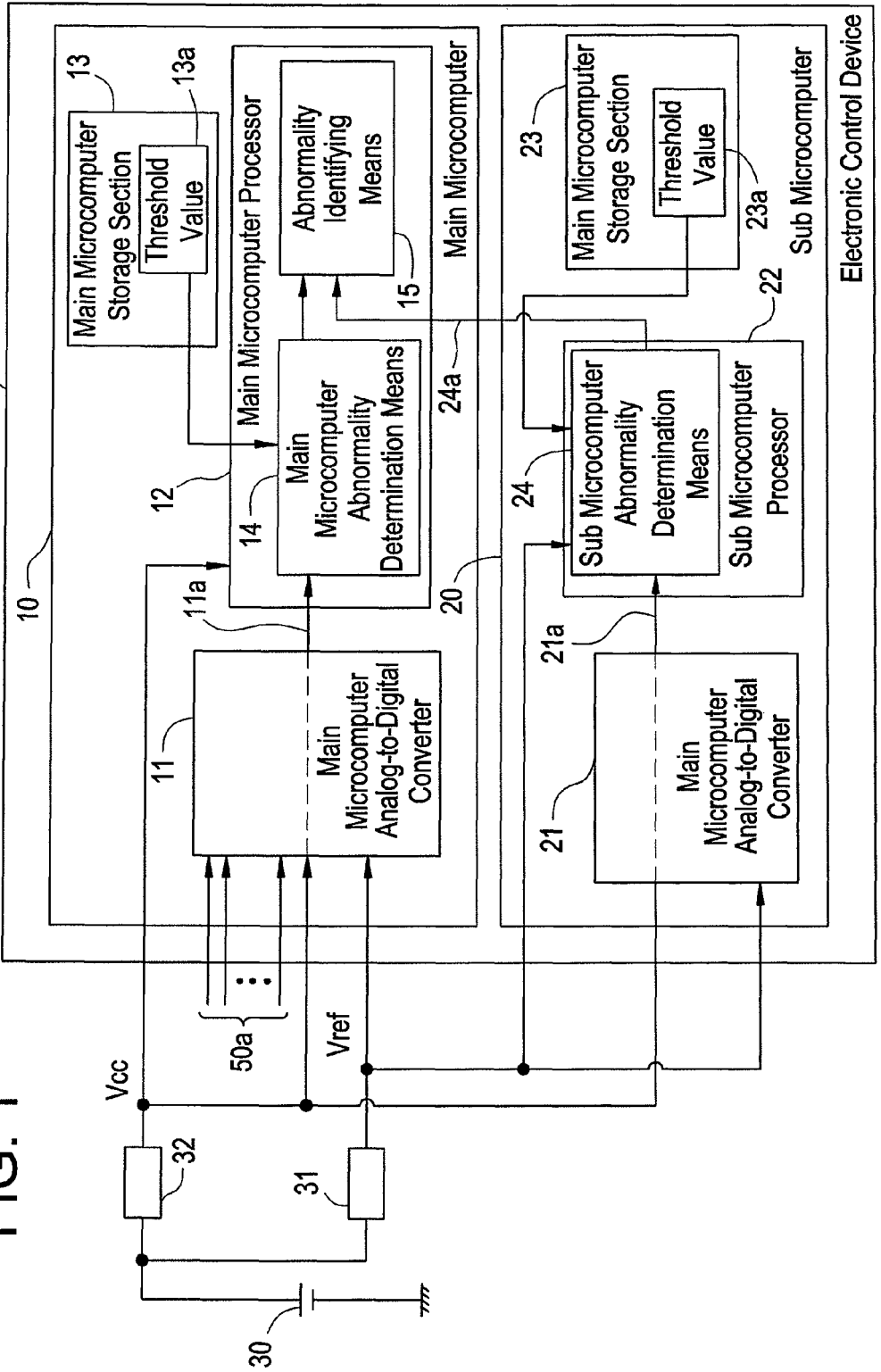
FIG. 1 is a block diagram illustrating an electronic control device according to a first embodiment of the present invention.

FIG. 1 is a block diagram illustrating an electronic control device according to a first embodiment of the present invention.

In FIG. 1, an electronic control device 1 is used for, for example, control of a vehicle drive system, for anon-vehicle device, and for other such purposes. Further, the electronic control device 1 is connected to a first constant voltage circuit 31 and a second constant voltage circuit 32 (first voltage source and second voltage source) that are formed of, for example, regulators. The first constant voltage circuit 31 and the second constant voltage circuit 32 have mutually independent circuit configurations.

The first constant voltage circuit 31 generates Vref as a reference voltage for analog-to-digital conversion from a voltage of an external power source 30 such as a battery. The second constant voltage circuit 32 generates Vcc as a voltage for abnormality determination from the voltage of the external power source 30. The electronic control device 1 receives an input of Vref from the first constant voltage circuit 31, and receives an input of Vcc from the second constant voltage circuit 32.

Here, in a case where the electronic control device 1 is applied to the control of the vehicle drive system or to the on-vehicle device, it is assumed that fluctuations occur in Vref so as to correspond to the fluctuations in a battery voltage of a vehicle due to cranking of an engine, control of an idling-stop system (ISS), or the like. However, the fluctuations in Vref do not affect Vcc. Note that, Vref and Vcc are voltages having mutually different values. Further, Vref is higher than Vcc.

The electronic control device 1 includes a main microcomputer 10 and a sub microcomputer 20. The main microcomputer 10 includes a main microcomputer analog-to-digital converter 11, a main microcomputer processor (central processing unit) 12, a main microcomputer storage section 13 formed of a ROM, a RAM, or the like, main microcomputer abnormality determination means (failure diagnosis means) 14, and abnormality identifying means (failure site identifying means) 15.

The sub microcomputer 20 includes a sub microcomputer analog-to-digital converter 21, a sub microcomputer processor (central processing unit) 22, a sub microcomputer storage section 23 formed of a ROM, a RAM, or the like, and sub microcomputer abnormality determination means (failure diagnosis means) 24.

The main microcomputer analog-to-digital converter 11 receives inputs of a plurality of control signals 50a, Vref, and Vcc from an external portion. The plurality of control signals 50a are analog signals from, for example, external sensors. The main microcomputer analog-to-digital converter 11 uses Vref as an upper limit value for analog-to-digital conversion to subject the control signals 50a and Vcc to analog-to-digital conversion. The main microcomputer processor 12 operates by using Vcc as an operating voltage. The sub microcomputer processor 22 operates by using Vref as the operating voltage.

Digital data 11a on each of the control signals 50a and Vcc that have been subjected to the analog-to-digital conversion by the main microcomputer analog-to-digital converter 11 is input to the main microcomputer processor 12. The sub microcomputer analog-to-digital converter 21 receives inputs of Vref and Vcc from the external portion. The sub microcomputer analog-to-digital converter 21 uses Vref to subject Vcc to the analog-to-digital conversion. Digital data 21a on Vcc that has been subjected to the analog-to-digital conversion by the sub microcomputer analog-to-digital converter 21 is input to the sub microcomputer processor 22.

The main microcomputer processor 12 uses the digital data 11a on the control signals 50a to control an operation of a control subject. Here, the main microcomputer storage section 13 stores programs for implementing the respective functions of the main microcomputer abnormality determination means 14 and the abnormality identifying means 15 and a threshold value 13a for abnormality determination (failure diagnosis). The main microcomputer processor 12 can implement the functions of the main microcomputer abnormality determination means 14 and the abnormality identifying means 15 by executing the programs stored in the main microcomputer storage section 13.

In the same manner, the sub microcomputer storage section 23 stores a program for implementing the function of the sub microcomputer abnormality determination means 24 and a threshold value 23a for abnormality determination. The sub microcomputer processor 22 can implement the function of the sub microcomputer abnormality determination means 24 by executing the program stored in the sub microcomputer storage section 23.

The main microcomputer abnormality determination means 14 checks whether or not a voltage value of Vcc based on the digital data 11a output from the main microcomputer analog-to-digital converter 11 is equal to or higher than the threshold value 13a to thereby perform the abnormality determination for the main microcomputer analog-to-digital converter 11 and Vref. Specifically, if the voltage value of Vcc is lower than the threshold value 13a, the main microcomputer abnormality determination means determines that the main microcomputer analog-to-digital converter 11 or Vref is abnormal (in failure). On the other hand, if the voltage value of Vcc is equal to or higher than the threshold value 13a, the main microcomputer abnormality determination means determines that the main microcomputer analog-to-digital converter 11 and Vref are normal.

In the same manner, the sub microcomputer abnormality determination means 24 checks whether or not a voltage value of Vcc based on the digital data 21a output from the sub microcomputer analog-to-digital converter 21 is equal to or higher than the threshold value 23a to thereby perform the abnormality determination for the sub microcomputer analog-to-digital converter 21 and Vref. Specifically, if the voltage value of Vcc is lower than the threshold value 23a, the sub microcomputer abnormality determination means 24 determines that the sub microcomputer analog-to-digital converter 21 or Vref is abnormal.

On the other hand, if the voltage value of Vcc is equal to or higher than the threshold value 23a, the sub microcomputer abnormality determination means 24 determines that the sub microcomputer analog-to-digital converter 21 and Vref are normal. Here, each of the threshold values 13a and 23a is, for example, a value lower than the voltage value of Vcc in a normal state by approximately 1% to 10%. That is, a range from the voltage value of Vcc in the normal state to each of the threshold values 13a and 23a is a predetermined normal range. Note that, even if the voltage value of Vcc exceeds a preset upper limit value (threshold value defining an upper limit), the main microcomputer abnormality determination means 14 and the sub microcomputer abnormality determination means 24 may determine that the main microcomputer analog-to-digital converter 11, the sub microcomputer analog-to-digital converter 21, and Vref are abnormal.

The abnormality identifying means 15 receives an abnormality determination result from each of the main microcomputer abnormality determination means 14 and the sub microcomputer abnormality determination means 24. Further, the abnormality identifying means 15 identifies an abnormality occurring site by using the abnormality determination results from both the main microcomputer abnormality determination means 14 and the sub microcomputer abnormality determination means 24. Specifically, the abnormality identifying means 15 determines that Vref (first constant voltage circuit 31 or wiring) is abnormal when both the main microcomputer abnormality determination means 14 and the sub microcomputer abnormality determination means 24 determine the abnormalities.

Further, the abnormality identifying means 15 determines that the main microcomputer analog-to-digital converter 11 is abnormal when the main microcomputer abnormality determination means 14 determines the abnormality and the sub microcomputer abnormality determination means 24 determines the normality. In addition, the abnormality identifying means 15 determines that the sub microcomputer analog-to-digital converter 21 is abnormal when the main microcomputer abnormality determination means 14 determines the normality and only the sub microcomputer abnormality determination means 24 determines the abnormality. Note that, after identifying the abnormality occurring site, the abnormality identifying means 15 may notify a user of the occurrence of the abnormality and the abnormality occurring site by, for example, displaying the information on a display or lighting/flashing an indicator.

According to the first embodiment as described above, when the voltage value of Vcc that has been output from the second constant voltage circuit 32 independent of the first constant voltage circuit 31 and subjected to the analog-to-digital conversion falls out of the predetermined normal range, the main microcomputer abnormality determination means 14 determines that any one of the main microcomputer analog-to-digital converter 11 and Vref is abnormal. In the same manner, the sub microcomputer abnormality determination means 24 determines that any one of the sub microcomputer analog-to-digital converter 21 and Vref is abnormal. With this configuration, even if fluctuations occur in Vref, the fluctuations in Vref can be detected, and hence the abnormalities in the main microcomputer analog-to-digital converter 11 and the sub microcomputer analog-to-digital converter 21 can be detected and at the same time the abnormality in Vref can be detected.

Figure 2:
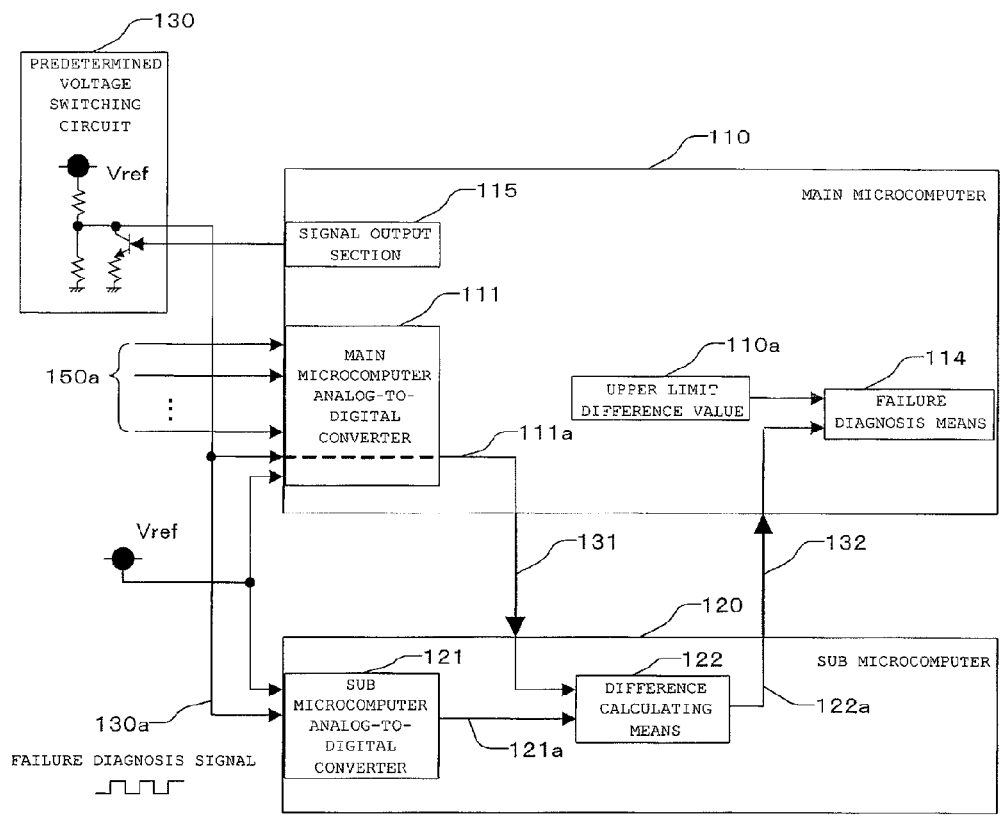
FIG. 2 is a block diagram illustrating a conventional electronic control device.

Here, in the conventional device as illustrated in FIG. 2, if the failure diagnosis means 114 detects a failure, it is impossible to distinguish which of a main microcomputer analog-to-digital converter 111 and a sub microcomputer analog-to-digital converter 121 is in failure. In contrast, in the first embodiment, each of the main microcomputer 10 and the sub microcomputer 20 determines the abnormality in its own analog-to-digital converter 11 or 21, and hence it is possible to distinguish between the abnormality in the main microcomputer analog-to-digital converter 11 and the abnormality in the sub microcomputer analog-to-digital converter 21.

Further, in the conventional device as illustrated in FIG. 2, when the failure diagnosis means 114 detects a failure, it is impossible to distinguish between the abnormality in the analog-to-digital converter 111 or 121 and the abnormality in Vref. In contrast, in the first embodiment, by comparing the abnormality determination result on the main microcomputer 10 with the abnormality determination result on the sub microcomputer 20, the abnormality identifying means 15 can distinguish the abnormality occurring site in such manner that the analog-to-digital converter 11 or 21 is identified as abnormal when any one of the main microcomputer 10 and the sub microcomputer 20 determines the abnormality and that Vref is abnormal when both thereof determine the abnormality.

In addition, in the conventional device as illustrated in FIG. 2, Vref is normally used also as a supply voltage (operating voltage) to a processor of a main microcomputer 110. Therefore, if an abnormality occurs in Vref, it is likely that an operation of the main microcomputer 110 cannot be guaranteed. In contrast, in the first embodiment, Vcc having a different voltage source from that of Vref is used as the operating voltage of the main microcomputer processor 12, and hence even when fluctuations occur in Vref, it is possible to reduce an operation abnormality in the main microcomputer processor 12, which can guarantee the operation.

Further, in these days, microcomputers increasingly need Vcc as the operating voltage of the processor of the main microcomputer separately from peripheral circuits such as the analog-to-digital converter in order to reduce power consumption. In the case of using such Vcc, in the conventional device as illustrated in FIG. 2, the calculation of the processor of the main microcomputer 110 itself falls out of a guaranteed operating range when an abnormality occurs in Vcc, and a failure diagnosis operation performed by the failure diagnosis means 114 cannot be guaranteed. In contrast, in the first embodiment, Vcc is different from the operating voltage of the sub microcomputer processor 22, and Vcc is input to the sub microcomputer 20 and used for the abnormality determination. With this configuration, the calculation operation on the sub microcomputer 20 can be guaranteed even when the abnormality occurs in Vcc, and the abnormality in Vcc can be detected on the sub microcomputer 20.

In addition, in the conventional device as illustrated in FIG. 2, it is necessary to add the communication lines 131 and 132 for transmitting/receiving data between the main microcomputer 110 and the sub microcomputer 120 and a communication processing for transmitting/receiving the main microcomputer analog-to-digital conversion data 111a and the difference value data 122a, which causes an increase in cost and an increase in processing load. In contrast, in the first embodiment, the main microcomputer abnormality determination means 14 and the sub microcomputer abnormality determination means 24 perform the abnormality determination on the data obtained by the analog-to-digital conversion performed by the main microcomputer analog-to-digital converter 11 and the sub microcomputer analog-to-digital converter 21, respectively. With this configuration, in a case of a configuration in which communications are not performed between microcomputers, it is possible to omit the communication lines 131 and 132 and possible to reduce the processing load related to the communications.

Further, in the conventional device as illustrated in FIG. 2, it is necessary to additionally provide special circuits such as a predetermined voltage switching circuit 130 for monitoring a failure of the main microcomputer analog-to-digital converter 111 and the sub microcomputer analog-to-digital converter 121 and processings for driving those special circuits, which causes an increase in cost and an increase in processing load. In contrast, Vcc of the first embodiment is a direct-current voltage, serving as both the operating voltage of the main microcomputer processor 12 and the voltage for abnormality determination. Accordingly, it is possible to omit the special circuits such as the predetermined voltage switching circuit 130 of the conventional device and to reduce the processing load for driving those special circuits.

In addition, in the conventional device as illustrated in FIG. 2, the respective processors of the main microcomputer 110 and the sub microcomputer 120 both have an operating voltage of Vref, thereby using the same voltage as the operating voltage. Therefore, the processors of the main microcomputer 110 and the sub microcomputer 120 simultaneously may fall out of the guaranteed operating range due to the fluctuations in Vref, and may not detect a failure. In contrast, in the first embodiment, the electronic control device 1 is applied to the control of the vehicle drive system, the on-vehicle device, or the like, and the voltage value of Vref is higher than the voltage value of Vcc. Therefore, even if the battery voltage of an automobile is lowered to a level between Vref and Vcc, the operation of the main microcomputer processor 12 is guaranteed owing to the normal voltage of Vcc, and the abnormality in Vref can be detected by the main microcomputer abnormality determination means 14.

One embodiment of the present invention has been described above, but the present invention is not limited to the above-mentioned embodiment, and various changes in design can be made within the scope of claims.

For example, in the first embodiment, Vcc is input through one line to each of the main microcomputer 10 and the sub microcomputer 20, but may be input through a plurality of lines. Further, the microcomputer may have a plurality of processors therein, and when different voltages need to be supplied to the respective processors, those voltages may be similarly input to the main microcomputer 10 and the sub microcomputer 20.

Further, in the first embodiment, Vcc is used as the voltage for abnormality determination input to the main microcomputer 10 and the sub microcomputer 20. However, the voltage for abnormality determination input to the main microcomputer 10 and the sub microcomputer 20 may be a voltage having a voltage value lower than Vref, and may be a voltage other than the operating voltage of the main microcomputer processor 12.

In addition, in the first embodiment, the abnormality identifying means 15 is disposed inside the main microcomputer 10, but may be provided outside the main microcomputer 10. In this case, the abnormality identifying means 15 can be implemented by an electrical circuit or a microcomputer other than the main microcomputer 10 and the sub microcomputer 20.

Further, the first embodiment describes the example of the configuration in which there are no communications performed between the main microcomputer 10 and the sub microcomputer 20. However, the present invention is not limited to this example, and can also be applied to a configuration in which the main microcomputer 10 and the sub microcomputer 20 communicate with each other and monitor each other.

In addition, in the first embodiment, the first constant voltage circuit 31 and the second constant voltage circuit 32 are provided outside the electronic control device 1, but the first constant voltage circuit 31 and the second constant voltage circuit 32 may be provided inside the electronic control device 1.

Further, the present invention can be applied to a configuration in which the sub microcomputer 20 is omitted. In addition, the present invention can be applied to any purposes for electronic devices other than the control of the vehicle drive system or the on-vehicle device.

What is claimed is:

1. An electronic control device, comprising:
   an analog-to-digital converter which receives as inputs: a reference voltage for analog-to-digital conversion output from a first controlled voltage source, a voltage for abnormality determination output from a second controlled voltage source independent of the first voltage source and has a voltage value lower than the reference voltage, and a control signal being an analog signal from an external detection source, and which converts the control signal and the voltage for abnormality determination into digital data by using the reference voltage;
   a processor configured to perform a control operation for a predetermined control subject by using the digital data of the control signal that is input from the analog-to-digital converter; and
   an abnormality determiner configured to monitor the voltage value of the voltage for abnormality determination based on the digital data input from the analog-to-digital converter to perform abnormality determination for the analog-to-digital converter and the reference voltage, and configured to determine that one of the analog-to-digital converter and the reference voltage is abnormal when the voltage value of the voltage for abnormality determination falls out of a predetermined normal range,
   wherein the reference voltage derives voltage from an external power source and is subject to fluctuations of the voltage output from the external power source, and
   wherein the voltage for the abnormality determination derives voltage from the external power source and is not subject to the fluctuations of the reference voltage.

2. An electronic control device according to claim 1, wherein the electronic control device is used for operation control of one of a vehicle drive system and an on-vehicle device that serves as the predetermined control subject.

3. The electronic control device according to claim 1, wherein the voltage for the abnormality determination is an operating voltage of the electronic control device, and is a direct-current voltage.

4. An electronic control device, comprising:
   an analog-to-digital converter which receives as inputs: a reference voltage for analog-to-digital conversion output from a first controlled voltage source, a voltage for abnormality determination output from a second controlled voltage source independent of the first voltage source and has a voltage value lower than the reference voltage, and a control signal being an analog signal from an external detection source, and which converts the control signal and the voltage for abnormality determination into digital data by using the reference voltage;
   a processor configured to perform a control operation for a predetermined control subject by using the digital data of the control signal that is input from the analog-to-digital converter; and
   an abnormality determiner configured to monitor the voltage value of the voltage for abnormality determination based on the digital data input from the analog-to-digital converter to perform abnormality determination for the analog-to-digital converter and the reference voltage, and configured to determine that one of the analog-to-digital converter and the reference voltage is abnormal when the voltage value of the voltage for abnormality determination falls out of a predetermined normal range, wherein the first voltage source and the second voltage source have mutually independent circuit configurations, and wherein the inputs to the analog-to-digital converter are directly from the first controlled voltage source and the second controlled voltage source.

5. An electronic control device, comprising:

an analog-to-digital converter which receives as inputs: a reference voltage for analog-to-digital conversion output from a first controlled voltage source, a voltage for abnormality determination output from a second controlled voltage source independent of the first voltage source and has a voltage value lower than the reference voltage, and a control signal being an analog signal from an external detection source, and which converts the control signal and the voltage for abnormality determination into digital data by using the reference voltage;

a processor configured to perform a control operation for a predetermined control subject by using the digital data of the control signal that is input from the analog-to-digital converter; and an abnormality determiner configured to monitor the voltage value of the voltage for abnormality determination based on the digital data input from the analog-to-digital converter to perform abnormality determination for the analog-to-digital converter and the reference voltage, and configured to determine that one of the analog-to-digital converter and the reference voltage is abnormal when the voltage value of the voltage for abnormality determination falls out of a predetermined normal range, wherein the voltage for the abnormality determination is an operating voltage of the electronic control device, and wherein the control signal comprises a signal from an external sensor.

6. An electronic control device, comprising:

an analog-to-digital converter which receives as inputs: a reference voltage for analog-to-digital conversion output from a first controlled voltage source, a voltage for abnormality determination output from a second controlled voltage source independent of the first voltage source and has a voltage value lower than the reference voltage, and a control signal being an analog signal from an external detection source, and which converts the control signal and the voltage for abnormality determination into digital data by using the reference voltage;

a processor configured to perform a control operation for a predetermined control subject by using the digital data of the control signal that is input from the analog-to-digital converter; and an abnormality determiner configured to monitor the voltage value of the voltage for abnormality determination based on the digital data input from the analog-to-digital converter to perform abnormality determination for the analog-to-digital converter and the reference voltage, and configured to determine that one of the analog-to-digital converter and the reference voltage is abnormal when the voltage value of the voltage for abnormality determination falls out of a predetermined normal range, wherein the abnormality determiner performs the abnormality determination by comparing the digital value of the voltage for abnormality determination to a predetermined threshold value, and based on the comparison, determines that one of the analog-to-digital converter and the reference voltage is abnormal.

7. An electronic control device, comprising:

an analog-to-digital converter which receives as inputs: a reference voltage for analog-to-digital conversion output from a first controlled voltage source, a voltage for abnormality determination output from a second controlled voltage source independent of the first voltage source and has a voltage value lower than the reference voltage, and a control signal being an analog signal from an external detection source, and which converts the control signal and the voltage for abnormality determination into digital data by using the reference voltage;

a processor configured to perform a control operation for a predetermined control subject by using the digital data of the control signal that is input from the analog-to-digital converter; and an abnormality determiner configured to monitor the voltage value of the voltage for abnormality determination based on the digital data input from the analog-to-digital converter to perform abnormality determination for the analog-to-digital converter and the reference voltage, and configured to determine that one of the analog-to-digital converter and the reference voltage is abnormal when the voltage value of the voltage for abnormality determination falls out of a predetermined normal range, wherein the abnormality determiner performs the abnormality determination by comparing the digital value of the voltage for abnormality determination to a predetermined threshold value to determine whether the voltage for the abnormality determination is lower than the threshold, and wherein, if the comparison determines that the voltage for the abnormality determination is lower than the threshold, the abnormality determiner determines that one of the analog-to-digital converter and the reference voltage is abnormal.

8. An electronic control device, comprising:

a main microcomputer comprising:

an analog-to-digital converter which receives as inputs: a reference voltage for analog-to-digital conversion output from a first controlled voltage source; a voltage for abnormality determination output from a second controlled voltage source independent of the first voltage source and has a voltage value lower than the reference voltage; and a control signal being an analog signal, and which converts the control signal and the voltage for abnormality determination into digital data by using the reference voltage;

a processor configured to perform a control operation for a predetermined control subject by using the digital data of the control signal that is input from the analog-to-digital converter; and abnormality determiner configured to monitor the voltage value of the voltage for abnormality determination based on the digital data input from the analog-to-digital converter to perform an abnormality determination for the analog-to-digital converter and the reference voltage, and configured to determine that one of the analog-to-digital converter and the reference voltage is abnormal when the voltage value of the voltage for abnormality determination falls out of a predetermined normal range; and a sub microcomputer comprising the processor, and the abnormality determiner, and a second analog to digital converter which receives as inputs: a reference voltage for analog-to digital conversion output from a first controlled voltage source; a voltage for abnormality determination output from a second controlled voltage source independent of the first voltage source and has a voltage value lower than the reference voltage; and which converts the voltage for abnormality determination into digital data by using the reference voltage, wherein:

the abnormality determiner of the main microcomputer performs the abnormality determination for the analog-to-digital converter of the main microcomputer; and the abnormality determiner of the sub microcomputer performs the abnormality determination for the second analog-to-digital converter of the sub microcomputer, wherein the reference voltage derives voltage from an external power source and is subject to fluctuations of the voltage output from the external power source, and wherein the voltage for the abnormality determination derives the voltage from the external power source and is not subject to the fluctuations of the reference voltage.

9. An electronic control device according to claim 8, further comprising abnormality identifying means for receiving and comparing results of the abnormality determination performed by the abnormality determiner of the main microcomputer and the abnormality determiner of the sub microcomputer, and based on the results of the comparing, identifying which of the analog-to-digital converter of the main microcomputer, the second analog-to-digital converter of the sub microcomputer, and the reference voltage is abnormal, wherein the second analog-to-digital converter does not receive the control signal.

10. An electronic control device according to claim 8, wherein the processor of the main microcomputer receives the voltage for abnormality determination as an operating voltage.

11. An electronic control device according to claim 9, wherein the processor of the main microcomputer receives the voltage for abnormality determination as an operating voltage.

12. An electronic control device according to claim 8, wherein the processor of the sub microcomputer receives the reference voltage as an operating voltage.

13. An electronic control device according to claim 9, wherein the processor of the sub microcomputer receives the reference voltage as an operating voltage.

14. An electronic control device according to claim 10, wherein the processor of the sub microcomputer receives the reference voltage as an operating voltage.

15. An electronic control device according to claim 11, wherein the processor of the sub microcomputer receives the reference voltage as an operating voltage.

* * * * *